(12) United States Patent
Maehashi

(10) Patent No.: US 11,695,022 B2
(45) Date of Patent: Jul. 4, 2023

(54) IMAGE CAPTURING APPARATUS, IMAGE CAPTURING SYSTEM, AND MOVING BODY

(71) Applicant: CANON KABUSHIKI KAISHA, Tokyo (JP)

(72) Inventor: Yu Maehashi, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/099,622

(22) Filed: Nov. 16, 2020

(65) Prior Publication Data

US 2021/0151481 A1 May 20, 2021

(30) Foreign Application Priority Data

Nov. 20, 2019 (JP) ................... 2019-210035

(51) Int. Cl.
*H01L 27/146* (2006.01)
*H04N 5/357* (2011.01)
(Continued)

(52) U.S. Cl.
CPC .. *H01L 27/14603* (2013.01); *H01L 27/14609* (2013.01); *H01L 27/14643* (2013.01); *H04N 25/60* (2023.01); *H04N 25/76* (2023.01)

(58) Field of Classification Search
CPC ......... H01L 27/14603; H01L 27/14609; H01L 27/14643; H04N 5/357; H04N 5/374;
(Continued)

(56) References Cited

U.S. PATENT DOCUMENTS 10,312,275 B2 * 6/2019 Hynecek ................. H01L 29/08
10,996,323 B2 * 5/2021 Patanwala ............. G01S 17/894
(Continued)

FOREIGN PATENT DOCUMENTS

JP 2018512573 A 5/2018
JP 2018157387 A 10/2018
(Continued)

*Primary Examiner* — Albert H Cutler
(74) *Attorney, Agent, or Firm* — Canon U.S.A., Inc. IP Division

(57) ABSTRACT

An image capturing apparatus includes a plurality of photoelectric conversion elements, a first selection unit, and a second selection unit. Each of the photoelectric conversion elements includes an avalanche diode and a counter. The photoelectric conversion elements have a first photoelectric conversion element and a second photoelectric conversion element. The first selection unit controls the first photoelectric conversion element. The second selection unit controls the second photoelectric conversion element. The first and second selection units are controlled by a first control line and a second control line. In a first mode, the second selection unit controls the second photoelectric conversion element to be brought into a state where no signal is read from the second photoelectric conversion element. In a second mode, the second selection unit controls the second photoelectric conversion element to be brought into a state where a signal is read from the second photoelectric conversion element.

20 Claims, 13 Drawing Sheets

(51) Int. Cl.
- *H04N 5/374* (2011.01)
- *H04N 5/345* (2011.01)
- *H04N 5/3745* (2011.01)
- *H04N 25/60* (2023.01)
- *H04N 25/76* (2023.01)
- *H04N 25/443* (2023.01)
- *H04N 25/445* (2023.01)
- *H04N 25/772* (2023.01)
- *H04N 25/441* (2023.01)

(58) Field of Classification Search
CPC .. H04N 5/3452; H04N 5/3454; H04N 5/3456; H04N 5/37455; H04N 25/60; H04N 25/76; H04N 25/443; H04N 25/445; H04N 25/772; H04N 25/441

See application file for complete search history.

(56) References Cited

U.S. PATENT DOCUMENTS

| | | |
|---|---|---|
| 2011/0050969 A1 | 3/2011 | Nishihara |
| 2015/0115131 A1 | 4/2015 | Webster |
| 2017/0186798 A1 | 6/2017 | Yang |
| 2019/0170866 A1* | 6/2019 | Iguchi ............... G01S 7/484 |
| 2019/0189827 A1 | 6/2019 | Haraguchi |
| 2019/0252442 A1 | 8/2019 | Tanaka |
| 2019/0265333 A1* | 8/2019 | Ueno ................ G01S 7/4808 |
| 2020/0284884 A1* | 9/2020 | Henderson ......... G01S 7/4863 |

FOREIGN PATENT DOCUMENTS

| | | |
|---|---|---|
| JP | 2019107823 A | 7/2019 |
| JP | 2019140137 A | 8/2019 |

\* cited by examiner

FRONT VIEW

TOP VIEW

REAR VIEW

IMAGE CAPTURING APPARATUS, IMAGE CAPTURING SYSTEM, AND MOVING BODY

TECHNICAL FIELD

One disclosed aspect of the embodiments relates to an image capturing apparatus with an avalanche diode, an image capturing system, and a moving body.

DESCRIPTION OF THE RELATED ART

A photon-counting image capturing apparatus using an avalanche diode is known. An image capturing apparatus having a configuration in which a plurality of photoelectric conversion elements each including an avalanche diode is arranged in a matrix is discussed in United States Patent Application Publication No. 2015/0115131.

The image capturing apparatus discussed in United States Patent Application Publication No. 2015/0115131 leaves room for improvement in characteristics of the image capturing apparatus, such as power consumption and signal readout speed. In the image capturing apparatus discussed in United States Patent Application Publication No. 2015/0115131, if avalanche multiplication is constantly caused in each of the photoelectric conversion elements to read out signals therefrom, the power consumption increases and it takes a lot of time to complete reading out signals from all the photoelectric conversion elements.

SUMMARY

According to an aspect of the present disclosure, an image capturing apparatus includes a plurality of photoelectric conversion elements, a first selection unit, and a second selection unit. The plurality of photoelectric conversion elements is disposed in a first direction and a second direction. Each of the plurality of photoelectric conversion elements includes an avalanche diode and a counter configured to count signals based on light incident on the avalanche diode. The plurality of photoelectric conversion elements has a first photoelectric conversion element and a second photoelectric conversion element. The first selection unit is configured to control the first photoelectric conversion element. The second selection unit is configured to control the second photoelectric conversion element. The first and second selection units are controlled by a first control line disposed extending in the first direction and a second control line disposed extending in the second direction. In a first mode, the first selection unit controls the first photoelectric conversion element to be brought into a state where a signal is read out from the first photoelectric conversion element, and the second selection unit controls the second photoelectric conversion element to be brought into a state where no signal is read out from the second photoelectric conversion element. In a second mode set in a period different from a period in which the first mode is set, the second selection unit controls the second photoelectric conversion element, which has been controlled to be brought into the state where no signal is read out from the second photoelectric conversion element, to be brought into a state where a signal is read out from the second photoelectric conversion element.

Further features of the present disclosure will become apparent from the following description of exemplary embodiments with reference to the attached drawings.

DESCRIPTION OF THE EMBODIMENTS

Figure 1:
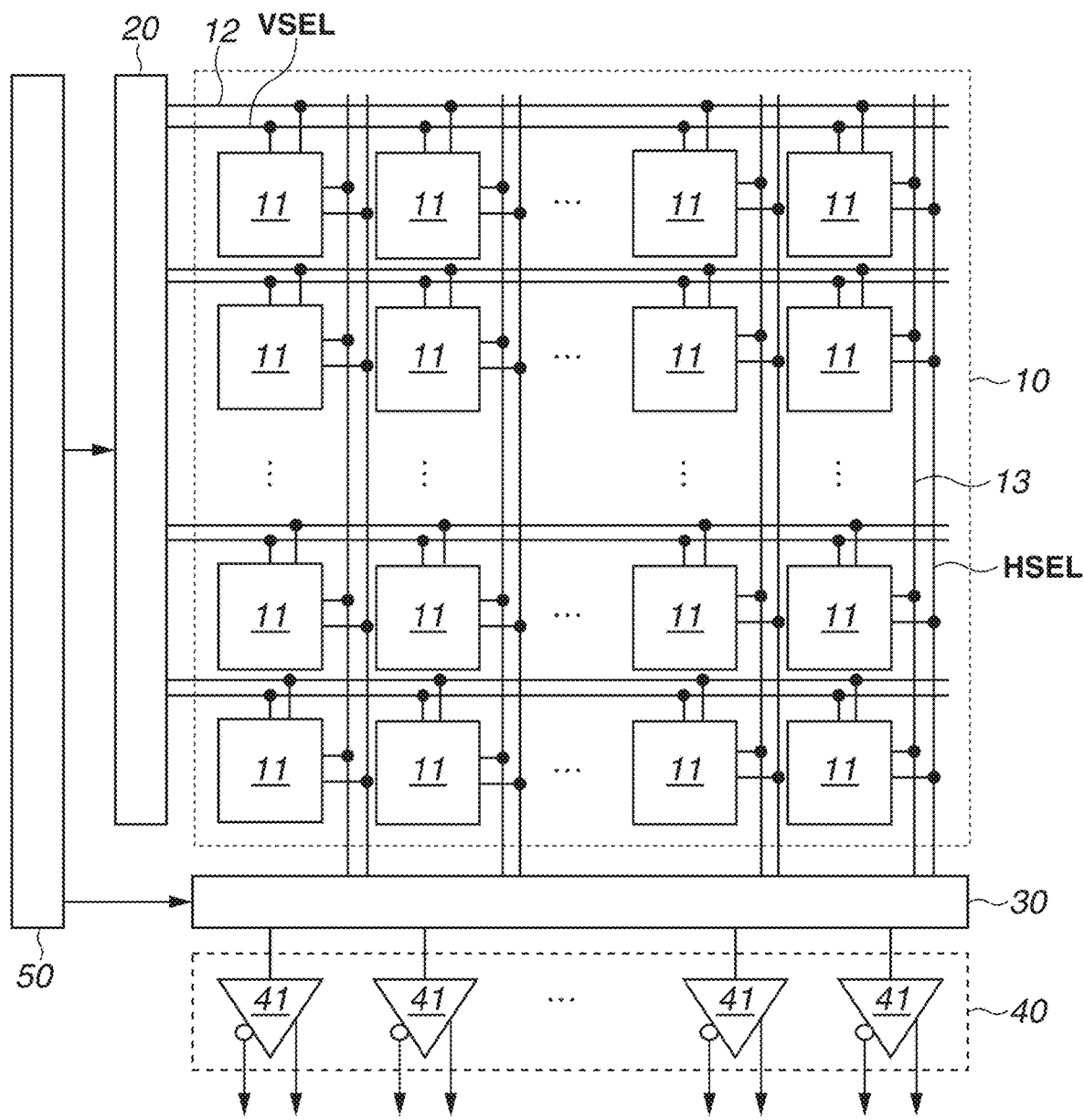
FIG. 1 is a schematic diagram illustrating an example of a photon-counting image capturing apparatus using avalanche diodes.
Figure 2:
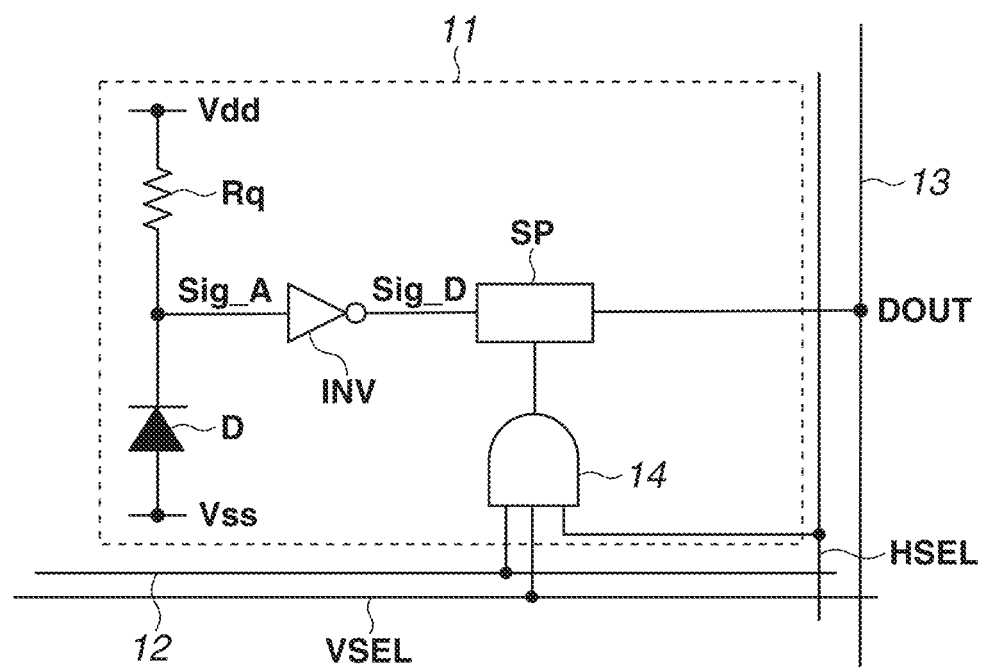
FIG. 2 is an equivalent circuit diagram of a photoelectric conversion element according to a first exemplary embodiment.

An image capturing apparatus according to a first exemplary embodiment will be described with reference to FIGS. 1 to 4E. FIG. 1 is a block diagram illustrating a schematic configuration of the image capturing apparatus according to the present exemplary embodiment. FIG. 2 is a circuit diagram illustrating a configuration example of a photoelectric conversion element 11 in the image capturing apparatus according to the present exemplary embodiment. A configuration in which one photoelectric conversion element 11 constitutes one pixel will be described below. However, a configuration in which more than one photoelectric conversion element 11 constitutes one pixel is also included in exemplary embodiments of the present disclosure.

As illustrated in FIG. 1, the image capturing apparatus includes a pixel region 10, a vertical scanning circuit 20, a horizontal scanning circuit 30, an output circuit 40, and a control circuit 50. In the pixel region 10, a plurality of the photoelectric conversion elements 11 is arranged in a matrix including a plurality of rows and a plurality of columns. The photoelectric conversion elements 11 arranged in the plurality of rows and the plurality of columns do not need to include all components illustrated in FIG. 2. Each of the photoelectric conversion elements 11 arranged in the plurality of rows and the plurality of columns has only to include at least an avalanche diode.

In each row of the pixel region 10, a control line 12 is disposed and extends in a first direction (lateral direction in FIG. 1). The control line 12 is connected to each of the photoelectric conversion elements 11 arranged in the first direction, and thus forms a signal line common to the photoelectric conversion elements 11. The first direction in which the control line 12 extends is also referred to as a row direction or horizontal direction. The control line 12 in each row of the pixel region 10 may include a plurality of signal lines for supplying various types of control signals to the photoelectric conversion elements 11.

In the pixel region 10, a control line VSEL that extends in the first direction and is connected to a selection unit or circuit 14 (illustrated in FIG. 2) included in each of the photoelectric conversion elements 11 is also disposed. In the example illustrated in FIGS. 1 and 2, each of the photoelectric conversion elements 11 includes the selection unit 14, and thus the control line VSEL is disposed in each row of the pixel region 10. However, the layout of the control lines VSEL is not limited thereto. If the selection unit 14 is shared by more than one photoelectric conversion element 11, the control lines VSEL have only to be disposed corresponding to the photoelectric conversion elements 11 in which the selection unit 14 is disposed.

In each column of the pixel region 10, a data line 13 is disposed and extends in a second direction (longitudinal direction in FIG. 1) that crosses the first direction. The data line 13 is connected to each of the plurality of photoelectric conversion elements 11 arranged in the second direction, and thus forms a signal line common to the photoelectric conversion elements 11. The second direction in which the data line 13 extends is also referred to as a column direction or vertical direction. The data line 13 in each column of the pixel region 10 may include a plurality of signal lines for transferring digital signals output from the photoelectric conversion elements 11 on a bit basis.

In the pixel region 10, a control line HSEL that extends in the second direction and is connected to the selection unit 14 included in each of the photoelectric conversion elements 11 is also disposed. In the example illustrated in FIGS. 1 and 2, each of the photoelectric conversion elements 11 includes the selection unit 14, and thus the control line HSEL is disposed in each column of the pixel region 10. However, the layout of the control lines HSEL is not limited thereto. If the selection unit 14 is shared by more than one photoelectric conversion element 11, the control lines HSEL have only to be disposed corresponding to the photoelectric conversion elements 11 in which the selection unit 14 is disposed.

The control line 12 and the control line VSEL in each row of the pixel region 10 are connected to the vertical scanning circuit 20. The vertical scanning circuit 20 supplies the photoelectric conversion elements 11 with control signals for reading out signals from the photoelectric conversion elements 11 through the control lines 12.

The control line 12, for example, controls a signal processing circuit SP (illustrated in FIG. 2) included in each of the photoelectric conversion elements 11. The vertical scanning circuit 20 sequentially scans the photoelectric conversion elements 11 in the pixel region 10 on a row-by-row basis, and outputs signals from the respective photoelectric conversion elements 11 to the output circuit 40 through the data lines 13. The control line VSEL controls the selection unit 14 included in each of the photoelectric conversion elements 11.

The data line 13 in each column of the pixel region 10 is connected to the horizontal scanning circuit 30. The control line HSEL in each column of the pixel region 10 is connected to the horizontal scanning circuit 30. The horizontal scanning circuit 30 selects signals of the photoelectric conversion elements 11 in each column of the pixel region 10, which are output from the pixel region 10 on a row-by-row basis, and sequentially outputs the selected signals to the output circuit 40. The horizontal scanning circuit 30 includes a plurality of holding units respectively corresponding to the plurality of columns in the pixel region 10. The signals of the photoelectric conversion elements 11 in each column of the pixel region 10, which are output from the pixel region 10 on a row-by-row basis, are held in the corresponding holding unit. The horizontal scanning circuit 30 sequentially scans the respective holding units, and sequentially outputs, to the output circuit 40, the signals of the photoelectric conversion elements 11 held in the respective holding units.

The output circuit 40 includes transmitter circuits 41 and outputs, to the outside of the image capturing apparatus, the signals of the photoelectric conversion elements 11 output from the horizontal scanning circuit 30. Each of the transmitter circuits 41 can be configured with, for example, a Serializer/Deserializer (SerDes) transmission circuit. Examples of the SerDes transmission circuit include a low voltage differential signaling (LVDS) circuit and a scalable low voltage signaling (SLVS) circuit. An external interface circuit that constitutes the output circuit 40 is not particularly limited.

The control circuit 50 supplies control signals for controlling operations of the vertical scanning circuit 20 and the horizontal scanning circuit 30 and operation timings thereof. At least some of the control signals for controlling the operations of the vertical scanning circuit 20 and the horizontal scanning circuit 30 and the operation timings thereof may be supplied from the outside of the image capturing apparatus.

As illustrated in FIG. 2, the photoelectric conversion element 11 includes the avalanche diode D, a quench element Rq, a waveform shaping unit INV, and the signal processing circuit SP including a counter. The avalanche diode D can be configured with a photodiode that uses avalanche breakdown to multiply the electric charges generated by the incidence of photons. Specific examples of such a photodiode include an avalanche photo diode (APD) and a single photon avalanche diode (SPAD). The SPAD causes avalanche multiplication in a Geiger mode in which the diode is operated with a bias voltage higher than a breakdown voltage. The APD causes avalanche multiplication in a linear mode in which the diode is operated with a bias voltage close to and slightly higher than the breakdown voltage. An example where the SPAD is used will be described below. The avalanche diode D and the counter included in the signal processing circuit SP are connected to each other. The counter counts signals based on photons incident on the avalanche diode D. The quench element Rq is configured with, for example, a p-type metal oxide semiconductor (MOS) transistor. The waveform shaping unit INV is configured with, for example, an inverter circuit. The waveform shaping unit INV is connected to the counter.

A voltage Vss is supplied to an anode of the photodiode constituting the avalanche diode D. A cathode of the photodiode is connected to one end of the quench element Rq, and is also connected to an input terminal of the waveform shaping unit INV. The other end of the quench element Rq is supplied with a voltage Vdd. An output terminal of the waveform shaping unit INV is connected to an input terminal of the counter of the signal processing circuit SP. An output terminal of the signal processing circuit SP is connected to the corresponding data line 13.

The voltage Vss and the voltage Vdd are set in such a manner that a reverse bias voltage sufficient to operate the avalanche diode D in the Geiger mode can be applied to the avalanche diode D. For example, a negative high voltage is provided as the voltage Vss and a positive voltage substantially equal to a power supply voltage is provided as the voltage Vdd. In the present exemplary embodiment, the SPAD, which can be operated in the Geiger mode, is used as the photodiode constituting the avalanche diode D. In the present exemplary embodiment, a state where a reverse bias voltage that can cause avalanche multiplication is applied is also referred to as an active state, and a state where the reverse bias voltage that can cause avalanche multiplication is not applied is also referred to as an inactive state.

The avalanche diode D is in a state where the reverse bias voltage corresponding to a potential difference between the voltage Vdd and the voltage Vss is applied to the avalanche diode D. The reverse bias voltage is higher than the breakdown voltage of the avalanche diode D and is high enough to cause avalanche multiplication. (This state is referred to as the Geiger mode.) However, in a state where no photons are incident on the avalanche diode D, there are no carriers as sources, and thus no avalanche multiplication occurs and no current flows through the avalanche diode D (which is referred to as the standby state).

When photons are incident on the avalanche diode D in the standby state, the incident photons excite and generate carriers inside the avalanche diode D. The carriers generated inside the avalanche diode D are accelerated by a high electric field inside the avalanche diode D and causes avalanche multiplication, so that a large avalanche current occurs (which is referred to as the Geiger mode operation). This avalanche current flows through the quench element Rq. Due to a voltage drop caused by the avalanche current, the potential at the cathode of the avalanche diode D decreases and the potential difference between the terminals of the avalanche diode D decreases. Thus, the avalanche diode D exits the Geiger mode (enters a non-Geiger mode) and the avalanche multiplication stops. Carriers on the cathodes side of the avalanche diode D are gradually drained through the quench element Rq connected thereto as a load. In other words, since the voltage Vdd is supplied to the cathode of the avalanche diode D through the quench element Rq, the voltage supplied to the cathode of the avalanche diode D returns to the voltage Vdd. As a result, the potential difference between the terminals of the avalanche diode D returns to an initial voltage. In other words, the avalanche diode D returns to the Geiger mode or the standby state again.

Figure 3:
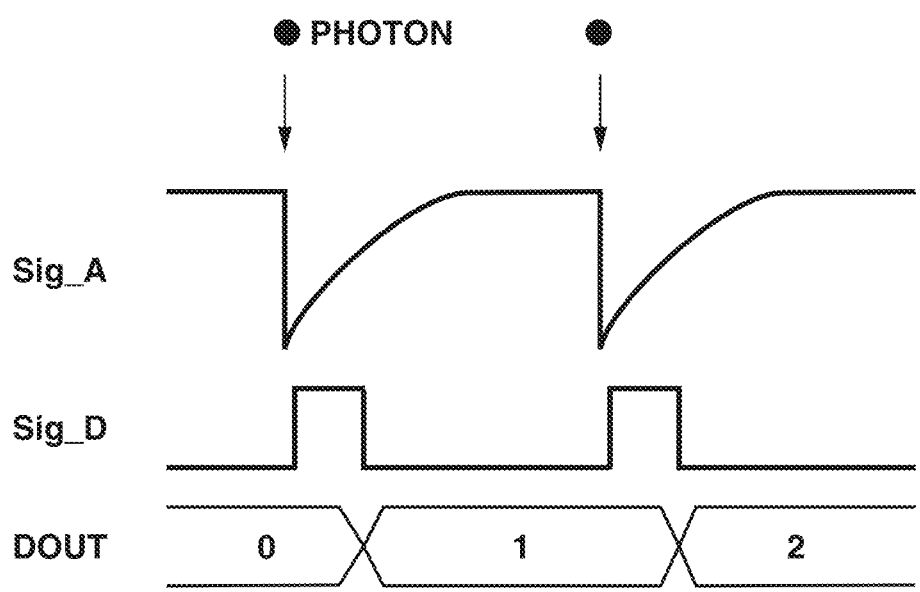
FIG. 3 is a timing diagram illustrating an example of a photon detection operation performed by the photoelectric conversion element according to the first exemplary embodiment.

Such series of operations will be described with reference to FIG. 3. FIG. 3 is a timing diagram illustrating a method for driving the image capturing apparatus according to the present exemplary embodiment. The timing diagram of FIG. 3 illustrates a timing when photons are incident on the avalanche diode D, and a signal Sig_A that is input to the waveform shaping unit INV. The timing diagram of FIG. 3 also illustrates a signal Sig_D that is obtained by shaping the waveform of the signal Sig_A into a pulse-like signal and is output to the signal processing circuit SP, and a count value (DOUT) of the signal Sig_D obtained by the signal processing circuit SP.

In an initial state, no photons are incident on the avalanche diode D, the signal Sig_A has a predetermined potential indicating the standby state, and the signal Sig_D is at a low level. The count value obtained by the signal processing circuit SP is 0.

When photons are incident on the avalanche diode D, avalanche multiplication occurs with the carriers excited by the incident photons as sources, and a flow of an avalanche current causes the potential of the signal Sig_A to decrease. When the signal Sig_A is less than or equal to a predetermined threshold, the potential of the signal Sig_D is shifted from the low level to a high level.

Then, the potential of the signal Sig_A gradually increases via the quench element Rq. When the signal Sig_A exceeds the predetermined threshold, the potential of the signal Sig_D is shifted from the high level to the low level.

The counter included in the signal processing circuit SP increments the count value by one based on the number of pulses of the signal Sig_D.

As described above, the waveform shaping unit INV generates pulses based on the presence or absence of an avalanche current caused by avalanche multiplication. The counter included in the signal processing circuit SP counts the number of pulses generated based on the presence or absence of the avalanche current. The signal processing circuit SP may perform not only the count operation, but also predetermined signal processing on the signal Sig_D.

The signal processing circuit SP outputs an output signal DOUT, which is a signal subjected to the signal processing, to the corresponding data line 13 based on the control signal output from the vertical scanning circuit 20 via the corresponding control line 12 and a control signal output from the selection unit 14 to be described below.

In the present exemplary embodiment, the selection unit 14 selects whether to output a signal from the signal processing circuit SP. The control line 12 and the control lines HSEL and VSEL are input to the signal processing circuit SP via the selection unit 14. When the control line 12 and the control lines HSEL and VSEL are all in the active state, a signal is read out from the signal processing circuit SP. When at least one of the control line 12 and the control lines HSEL and VSEL is in the inactive state, a signal is not read out from the signal processing circuit SP. As illustrated in FIG. 2, the selection unit 14 can be implemented using a combination circuit such as an AND circuit. However, the method for implementing the selection unit 14 is not limited thereto.

In the present exemplary embodiment, signals can be read out only from a desired region.

In the example illustrated in FIG. 2, the signal processing circuit SP is switched between the active state and the inactive state. More specifically, a switch is disposed at a node between the signal processing circuit SP and the corresponding data line 13, thereby controlling whether to read out a signal from the signal processing circuit SP to the data line 13. The term "active state" of the signal processing circuit SP used herein refers to a state where a signal is read out from the signal processing circuit SP. The term "inactive state" of the signal processing circuit SP used herein refers to a state where no signal is read out from the signal processing circuit SP.

FIGS. 4A to 4E each illustrate a readout region 10a and a non-readout region 10b in the pixel region 10. More specifically, FIGS. 4A to 4E each illustrate the region 10a where signals are read out from the photoelectric conversion elements 11 (first photoelectric conversion elements), and the region 10b where signals are not read out from the photoelectric conversion elements 11 (second photoelectric conversion elements). In the region 10b illustrated in FIGS.

4A to 4E, there is no need to constantly output signals from the photoelectric conversion elements 11. In a first mode, no signals may be output therefrom, and in a second mode set in a period different from the period in which the first mode is set, signals may be output therefrom.

Figure 4A:
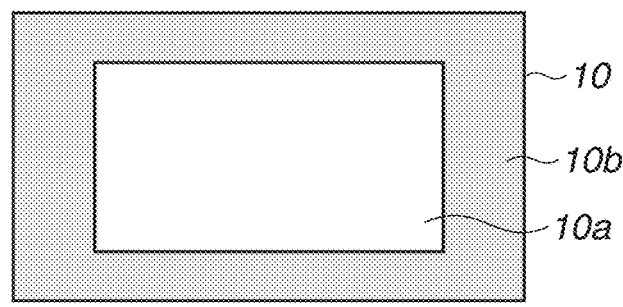
FIGS. 4A to 4E each illustrate a readout region and a non-readout region in a pixel region according to the first exemplary embodiment.
Figure 4B:
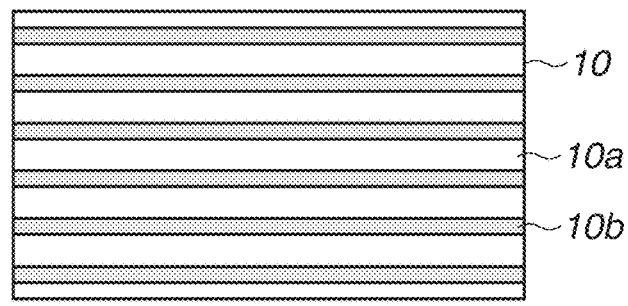

In the present exemplary embodiment, photoelectric conversion is performed on the region 10a and the region 10b. In other words, not only the region 10a but also the region 10b are irradiated with light. In the present exemplary embodiment, the photoelectric conversion is performed on the region 10a and the region 10b, but no signals are read out from the region 10b in terms of, for example, improvement in signal readout speed. In other words, whether to read out signals from the region 10b is controlled depending on the mode, even though the pixels are not defective. The term "mode" used herein refers to, for example, a period in which the vertical scanning circuit 20 performs vertical scanning on the photoelectric conversion elements 11 arranged in the region 10a. Referring to FIGS. 4A to 4B, a period in which scanning from the upper end to the lower end in first vertical scanning is finished corresponds to a first vertical scanning period, and a period in which the subsequent scanning from the upper end to the lower end is performed after the first vertical scanning is finished and the scanning position is returned from the lower end to the upper end corresponds to a second vertical scanning period. The foregoing operation will be described with reference to FIG. 4A. Assume herein that signals are read out from the region 10a in each of the first mode and the second mode. The first vertical scanning period is a period in which the photoelectric conversion elements 11 located at the upper end of the region 10a are scanned and then scanning of the photoelectric conversion elements 11 located at the lower end of the region 10a is finished. The second vertical scanning period is a period in which the photoelectric conversion elements 11 located at the upper end of the region 10a are scanned and then scanning of the photoelectric conversion elements 11 located at the lower end of the region 10a is finished. In the present exemplary embodiment, if no signals are read out from any of the photoelectric conversion elements 11 arranged in a certain row or column, vertical or horizontal scanning is not performed thereon. This leads to a reduction in signal readout time as compared with a case where signals are read out from all the photoelectric conversion elements 11 of the pixel region 10.

Figure 4C:
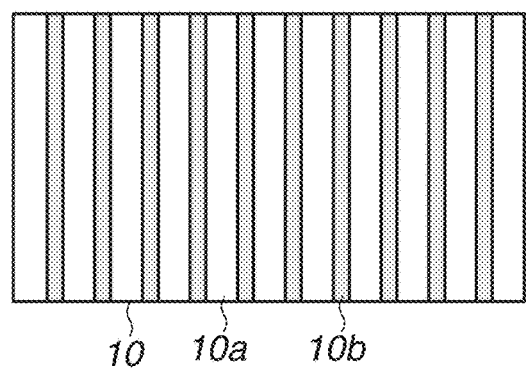
Figure 4D:
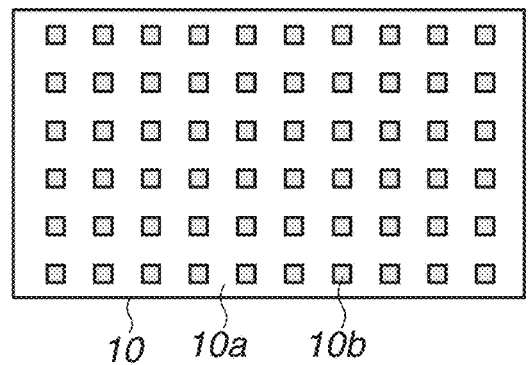
Figure 4E:
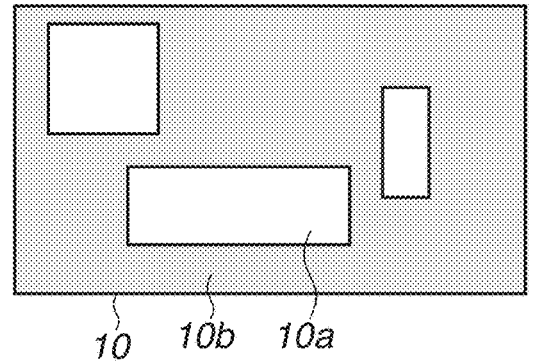
Figure 6:
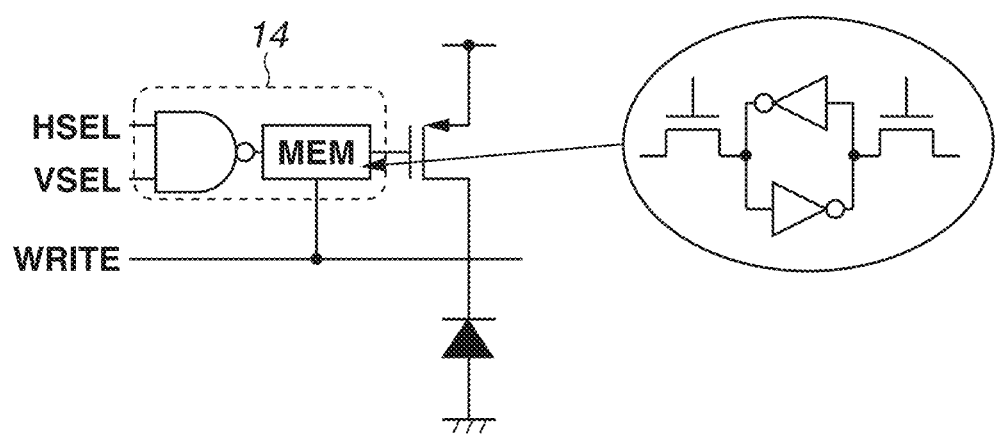
FIG. 6 is an equivalent circuit diagram illustrating another example of the photoelectric conversion element according to the second exemplary embodiment.

For example, in the example illustrated in FIG. 4A, a thinning-out readout operation for reading out signals only from a region of m×n pixels (m and n are natural numbers) is performed in the pixel region 10. The regions 10a and 10b can be controlled as illustrated in FIGS. 4B to 4D. FIG. 4B illustrates an example of a row thinning-out readout operation. More specifically, signals are read out from the photoelectric conversion elements 11 arranged in a predetermined number of rows, and no signals are read out from the photoelectric conversion elements 11 arranged in the rows other than the predetermined number of rows. FIG. 4C illustrates an example of a column thinning-out readout operation. More specifically, signals are read out from the photoelectric conversion elements 11 arranged in a predetermined number of columns, and no signals are read out from the photoelectric conversion elements 11 arranged in the columns other than the predetermined number of columns. FIG. 4D illustrates an example of a matrix thinning-out readout operation. More specifically, signals are read out from the photoelectric conversion elements 11 disposed at predetermined positions, instead of reading out signals on a matrix basis. The thinning-out readout operation may be performed on a pixel basis, instead of performing the operation on a row or column basis as illustrated in FIGS. 4A to 4D. For example, as illustrated in FIG. 6, the selection unit 14 includes a memory MEM, and the use of the memory MEM enables a Region Of Interest (ROI) readout operation as illustrated in FIG. 4E. More specifically, a signal indicating whether to read out a signal is written into the memory MEM included in each of the photoelectric conversion elements 11 via a signal line WRITE. Based on the signal, it is possible to control whether to supply a potential for turning on the switch or a potential for turning off the switch. In this way, a designer may implement the selection unit 14 with various configurations in order to obtain advantageous effects of the present exemplary embodiment.

The region 10a from which signals are read out in the first mode may be different from the region 10a from which signals are read out in the second mode. For example, first, in the first mode, signals are read out from the photoelectric conversion elements 11 arranged in the region 10a illustrated in FIGS. 4A to 4D. Then, in the second mode, signals are read out from the photoelectric conversion elements 11 arranged in the region 10b illustrated in FIGS. 4A to 4D and signals can also be read out from the photoelectric conversion elements 11 arranged in the region 10a. In the first mode, signals may be read out from the region 10a and no signals may be read out from the region 10b, and then, in the second mode, signals may be read out from both the region 10a and the region 10b. More specifically, in the second mode, the selection unit 14 (second selection unit) controls the photoelectric conversion elements 11, which have been controlled to be brought into a state where no signals are read out from the photoelectric conversion elements 11, to be brought into a state where signals are read out from the photoelectric conversion elements 11, and the photoelectric conversion elements 11, which have been controlled to be brought into a state where signals are read out from the photoelectric conversion elements 11, are maintained in the state where the signals are read out from the photoelectric conversion elements 11. Such a readout method is effective, for example, in a case where the image capturing apparatus performs image capturing in the first mode until a target object such as a suspicious person appears in a region where the image capturing apparatus performs the image capturing and then changes the first mode to the second mode when the target object appears in the region. An emphasis is placed on the signal readout speed until the target object appears, and after the target object appears, an emphasis is placed on the image quality. As described above, the mode can be switched depending on the purpose for image capturing.

In the case of capturing an image of a moving body, the ROI operation illustrated in FIG. 4E enables switching whether to read out signals, based on the position of the moving body. More specifically, in the first mode in which the moving body is located in a first portion of the region in which the image capturing is performed, signals are read out only from the first portion, and in the second mode in which the moving body is located in a second portion different from the first portion, signals are read out only from the second portion.

While FIG. 2 illustrates the example where the selection unit 14 is connected to the signal processing circuit SP, the selection unit 14 may be connected to an input unit of the waveform shaping unit INV, or to a node between the waveform shaping unit INV and the signal processing circuit SP. Also, in this case, the selection unit 14 can perform control in such a manner that the counter in the signal processing circuit SP does not count signals and no signals are output from the photoelectric conversion elements 11.

In the present exemplary embodiment, the photoelectric conversion elements 11 included in the region 10a are controlled to bring the signal processing circuits SP into the active state. Accordingly, signals are output from the signal processing circuits SP. The photoelectric conversion elements 11 included in the region 10b are controlled to bring the signal processing circuits SP into the inactive state. Accordingly, no signals are output from the signal processing circuits SP. Thus, in the present exemplary embodiment, the photoelectric conversion elements 11 belonging to the region 10b in which there is no need to read out signals can be selected. As a result, the signal readout speed of the image capturing apparatus can be improved as compared with a case where signals are read out from all the photoelectric conversion elements 11.

A photoelectric conversion element 11 according to a second exemplary embodiment will be described with reference to FIG. 5. The photoelectric conversion element 11 according to the present exemplary embodiment is different from that according to the first exemplary embodiment in that the selection unit 14 is connected to the quench element Rq. Components according to the present exemplary embodiments other than the components to be described below are similar to those according to the first exemplary embodiment.

In the present exemplary embodiment, the quench element Rq is configured with a MOS transistor. A gate terminal of the quench element Rq is connected to an output terminal of the selection unit 14 that controls turning on and off of the quench element Rq. The control line VSEL disposed in each row of the pixel region 10 and the control line HSEL disposed in each column of the pixel region 10 are input to the selection unit 14. In the present exemplary embodiment, turning on and off the quench element Rq is controlled based on the signals from the control lines VSEL and HSEL, thereby switching the avalanche diode D between the active state and the inactive state. When both the signals from the control lines VSEL and HSEL are in the active state, the selection unit 14 controls the quench element Rq to bring the avalanche diode D into the active state. More specifically, the quench element Rq is controlled so that a reverse bias voltage that can cause avalanche multiplication in the avalanche diode D is applied to the avalanche diode D. In the example illustrated in FIG. 5, the quench element Rq is configured with a p-channel MOS (PMOS) transistor. Accordingly, for example, a ground voltage is applied to the gate terminal of the PMOS transistor. When at least one of the signals from the control lines VSEL and HSEL is in the inactive state, the selection unit 14 controls the quench element Rq to bring the avalanche diode D into the inactive state. More specifically, the potential is controlled so as not to cause avalanche multiplication in the avalanche diode D. In the example illustrated in FIG. 5, for example, a potential higher than the voltage Vdd is applied to the gate terminal of the PMOS transistor to turn off the PMOS transistor. As a result, no potential (voltage Vdd) is supplied to the cathode, thereby causing no avalanche multiplication in the avalanche diode D.

When the avalanche diode D is in the active state, an avalanche current flows every time photons are incident on the avalanche diode D, and when the avalanche diode D is in the inactive state, the avalanche current is not generated even when photons are incident on the avalanche diode D. Accordingly, when the avalanche diode D is in the inactive state, the counter in the signal processing circuit SP cannot count signals, and thus no signal is read out from the photoelectric conversion element 11.

Figure 5:
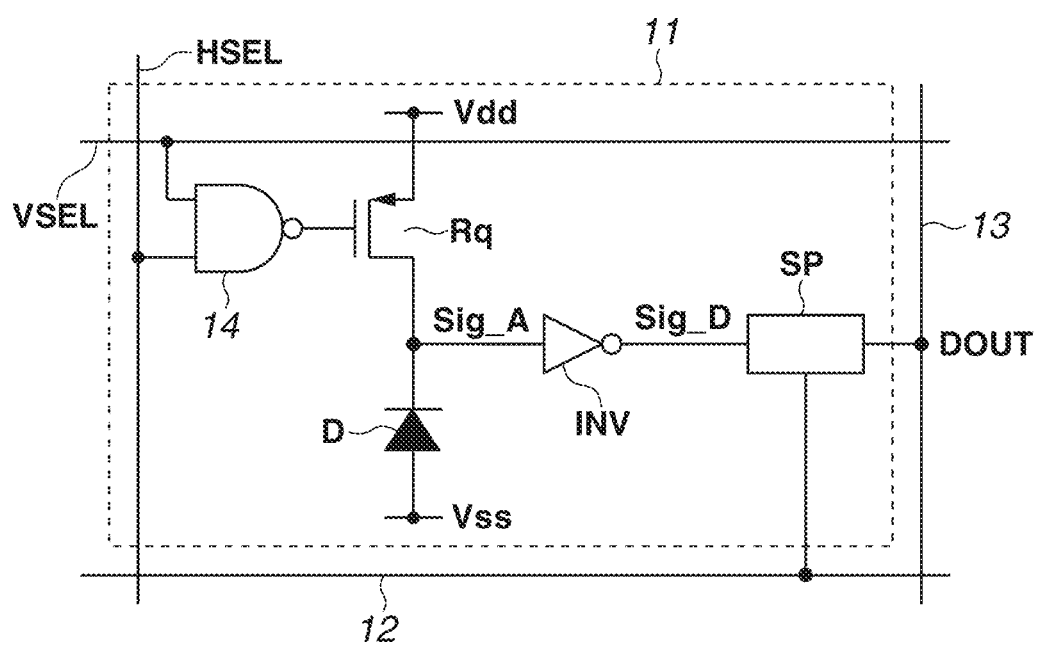
FIG. 5 is an equivalent circuit diagram illustrating an example of a photoelectric conversion element according to a second exemplary embodiment.

The selection unit 14 illustrated in FIG. 6 may be used instead of the selection unit 14 illustrated in FIG. 5. In this case, the signal line WRITE is required, and thus the number of signal lines used in the second exemplary embodiment is more than the number of signal lines used in the first exemplary embodiment. In this way, the selection unit 14 may be configured with the combination circuit and the memory MEM, and may control whether to bring the avalanche diode D into the active state or the inactive state, based on the signal input to the memory MEM.

In the present exemplary embodiment, the photoelectric conversion elements 11 located in the region 10b may be scanned. Even when the scanning is performed, the value of the counter indicates 0 because no avalanche current is generated. If all the photoelectric conversion elements 11 arranged in a certain row or column among the photoelectric conversion elements 11 in the region 10b are controlled to be brought into the state where no signals are read out from the photoelectric conversion elements 11, it is desirable not to perform vertical scanning or horizontal scanning thereon. In other words, it is desirable to perform scanning by thinning out the photoelectric conversion elements 11. This leads to an improvement in signal readout speed.

If the avalanche diodes D of all the photoelectric conversion elements 11 in the pixel region 10 are in the active state, every time photons are incident on the avalanche diodes D, an avalanche current flows and the counting operation is performed in all the photoelectric conversion elements 11. In other words, in the photoelectric conversion elements 11 belonging to the region 10b from which no signals are to be read out, wasteful power consumption occurs. On the other hand, in the present exemplary embodiment, since the avalanche diodes D of the photoelectric conversion elements 11 belonging to the region 10b are in the inactive state, no avalanche current occurs even when photons are incident on the avalanche diodes D, and thus the counting operation is not performed in the photoelectric conversion elements 11. Therefore, no wasteful power consumption occurs in the photoelectric conversion elements 11 belonging to the region 10b. As a result, power consumption can be reduced as compared with a case where signals are read out from all the photoelectric conversion elements 11. In the present exemplary embodiment, not only the advantageous effects described in the first exemplary embodiment, but also the advantageous effect of reducing power consumption in the image capturing apparatus can be obtained. When vertical scanning is omitted, the signal readout speed can also be improved.

A photoelectric conversion element 11 according to a third exemplary embodiment will be described with reference to FIGS. 7 and 8.

In the present exemplary embodiment, a switching unit 15 is connected to the anode of the avalanche diode D or a node of the quench element Rq that is different from the node to which the avalanche diode D is connected. In addition, the present exemplary embodiment differs from the second exemplary embodiment in that the selection unit 14 controls the switching unit 15. Components according to the present exemplary embodiment other than the components to be described below are similar to those according to the second exemplary embodiment.

Figure 7:
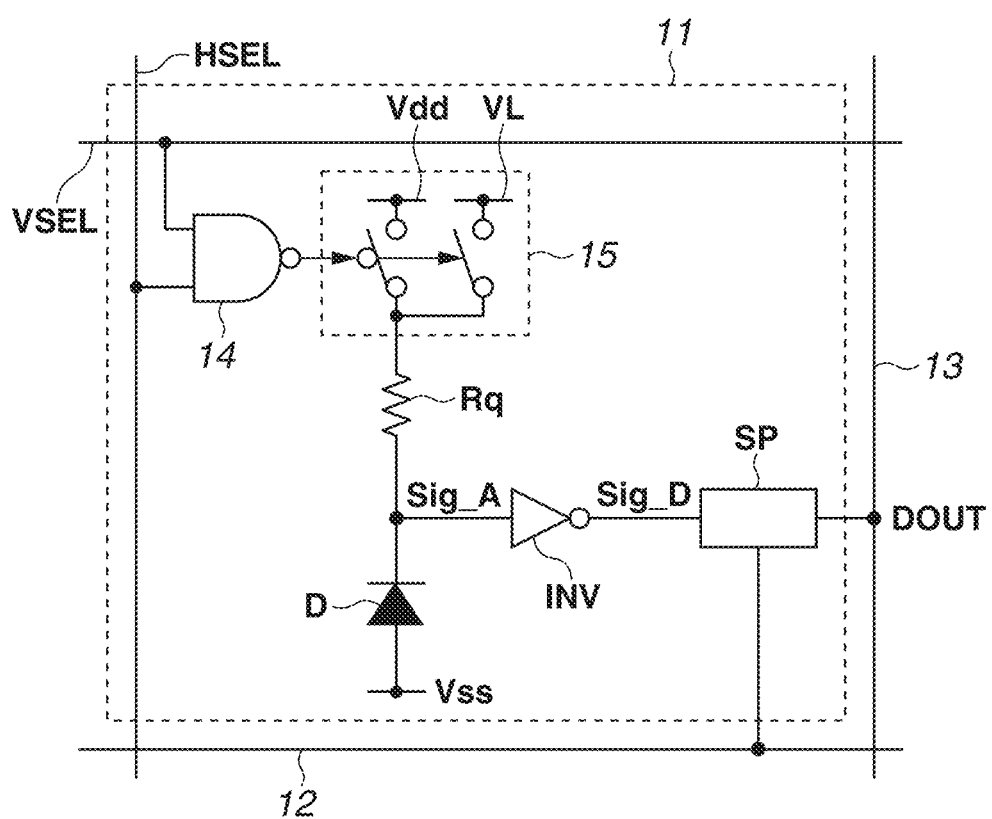
FIG. 7 is an equivalent circuit diagram illustrating an example of a photoelectric conversion element according to a third exemplary embodiment.

In the example illustrated in FIG. 7, when both the signals from the control lines VSEL and HSEL are in the active state, the selection unit 14 controls the switching unit 15 so that the quench element Rq is connected to the voltage Vdd.

In this case, the avalanche diode D is in the active state. When at least one of the signals from the control lines VSEL and HSEL is in the inactive state, the selection unit 14 controls the switching unit 15 so that the quench element Rq is connected to a voltage line VL. In this case, the avalanche diode D is in the inactive state and a voltage of the voltage line VL is set to any voltage at which avalanche multiplication does not occur in the avalanche diode D.

Figure 8:
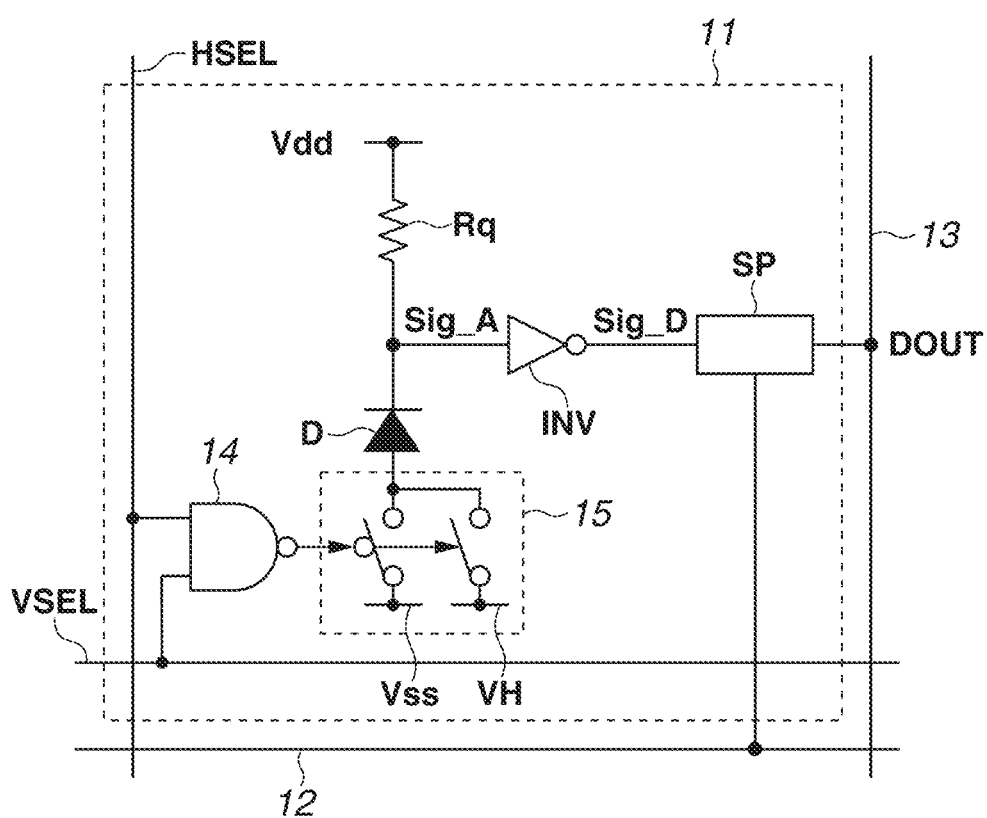
FIG. 8 is an equivalent circuit diagram illustrating another example of the photoelectric conversion element according to the third exemplary embodiment.

Similarly, in the example illustrated in FIG. 8, the switching unit 15 is provided at the anode of the avalanche diode D. When the avalanche diode D is controlled to be brought into the active state, the anode of the avalanche diode D is connected to the voltage Vss. When the avalanche diode D is controlled to be brought into the inactive state, the anode of the avalanche diode D is connected to a voltage line VH. In this case, a voltage of the voltage line VH is set to any voltage at which avalanche multiplication does not occur in the avalanche diode D.

Thus, in the present exemplary embodiment, the switching unit 15 selects the voltage line to be connected to the avalanche diode D between the voltage line supplied with a potential at which the avalanche diode D is in the active state, and the voltage line VL (VH) supplied with a potential at which the avalanche diode D is in the inactive state, via the selection unit 14. In the manner as described above, the active state and the inactive state of the avalanche diode D are controlled.

In the present exemplary embodiment, signals can be read out only from a desired region, similarly to the first exemplary embodiment, although the number of voltage lines used increases with the use of the voltage line VL or VH, compared to that in the first exemplary embodiment. In addition, similarly to the first exemplary embodiment, the active state and the inactive state of the avalanche diode D are controlled, which leads to a reduction in power consumption in the image capturing apparatus.

Figure 9:
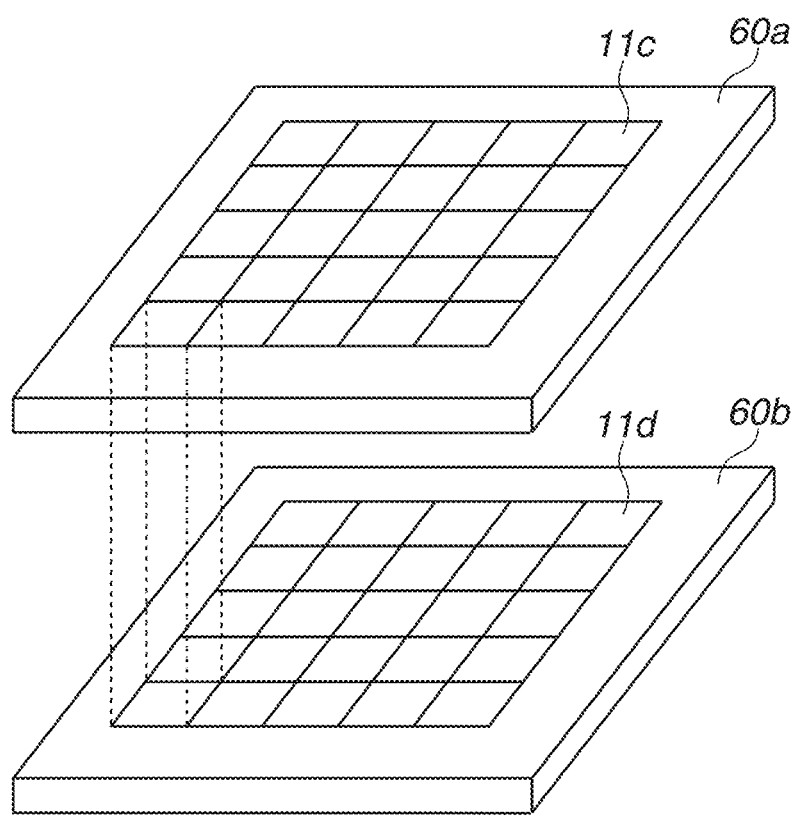
FIG. 9 is a schematic view illustrating a structure of an image capturing apparatus according to a fourth exemplary embodiment.

An image capturing apparatus according to a fourth exemplary embodiment will be described with reference to FIG. 9. FIG. 9 is a schematic view illustrating the structure of the image capturing apparatus according to the present exemplary embodiment. The image capturing apparatus according to the present exemplary embodiment has a structure in which a first substrate 60b and a second substrate 60a are stacked. The first substrate 60b includes a plurality of photoelectric conversion element cells (hereinafter referred to as cells) 11d each including the signal processing circuit SP. The second substrate 60a includes a plurality of cells 11c each including the avalanche diode D. The cells 11c are respectively connected to the cells 11d. More specifically, one cell 11c and one cell 11d are connected together to form one photoelectric conversion element 11.

In the present exemplary embodiment, the quench element Rq, the selection unit 14, and the waveform shaping unit INV can be arranged either in the cell 11c or the cell 11d. For example, the following layout examples can be used and particular effects can be expected from each of the layout examples. A designer can thus adopt various layout positions depending on the intended use.

Layout Example 1

Only the avalanche diode D can be disposed in the cell 11c, and all the other components can be arranged in the cell 11d. In this case, the area of the avalanche diode D is maximum, and thus the aperture ratio of the photoelectric conversion element 11 can be increased. In addition, the second substrate 60a can be formed in a process specialized in the avalanche diode D, and thus favorable pixel characteristics can be obtained.

Layout Example 2

When transistors having different breakdown voltages are included in the components of the photoelectric conversion element 11, only components with a low breakdown voltage can be arranged in the cell 11d.

For example, when the quench element Rq is configured with a transistor having a high breakdown voltage and the other transistors are configured with transistors having a low breakdown voltage, the avalanche diode D and the quench element Rq can be arranged in the cell 11c, and the other transistors can be arranged in the cell 11d. Alternatively, when the quench element Rq is configured with a transistor having a high breakdown voltage and an output stage of the selection unit 14 is also configured with a transistor having a high breakdown voltage, the avalanche diode D, the quench element Rq, and the output stage of the selection unit 14 can be arranged in the cell 11c, and thus the cell 11d can be configured only with transistors having a low breakdown voltage. Accordingly, the degree of integration of the second substrate 60a can be increased. In addition, the first substrate 60b can be formed in a process specialized in transistors with a low breakdown voltage, and thus favorable circuit characteristics can be obtained.

The layout of the components of the photoelectric conversion element 11 in the cell 11c and the cell 11d according to the present exemplary embodiment is not limited to the above-described examples, and various layouts can be used.

In the present exemplary embodiment, not only the advantageous effects described in the first to third exemplary embodiments, but also the advantageous effect of reducing the chip size of the image capturing apparatus while preventing a deterioration in pixel characteristics can be obtained.

Figure 10:
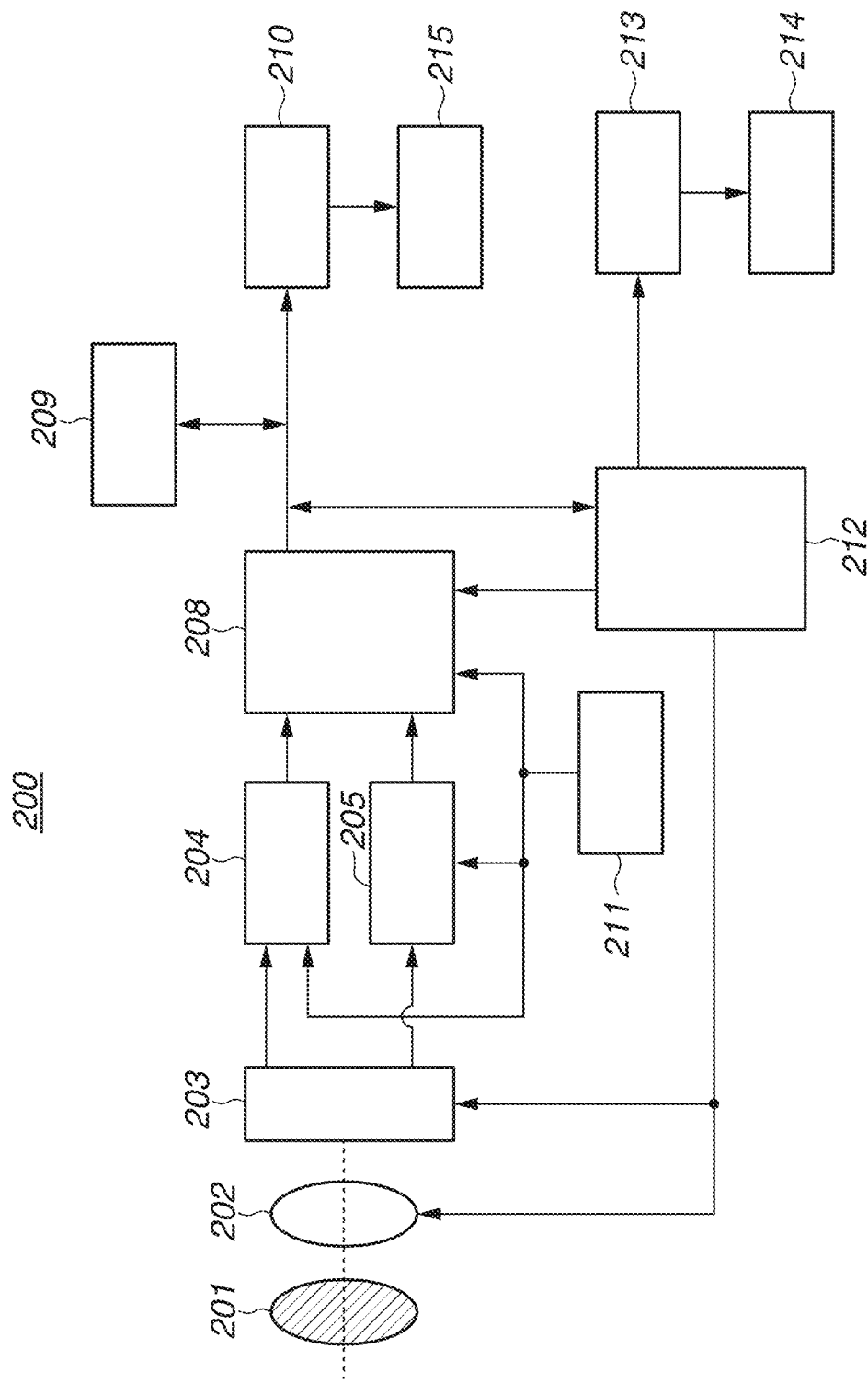
FIG. 10 is a block diagram illustrating a configuration of an image capturing system according to a fifth exemplary embodiment.

FIG. 10 is a block diagram illustrating a configuration of an image capturing system 200 according to a fifth exemplary embodiment. The image capturing system 200 according to the present exemplary embodiment includes an image capturing apparatus 204. In the present exemplary embodiment, any one of the image capturing apparatuses described in the exemplary embodiments described above can be used as the image capturing apparatus 204. Specific examples of the image capturing system 200 include a digital still camera, a digital camcorder, and a monitoring camera. FIG. 10 illustrates an example where a digital still camera is used as the image capturing system 200.

The image capturing system 200 illustrated in FIG. 10 includes the image capturing apparatus 204, a lens 202 for forming an optical image of a subject on the image capturing apparatus 204, a diaphragm 203 for varying the amount of light that passes through the lens 202, and a barrier 201 for protecting the lens 202. The lens 202 and the diaphragm 203 serve as an optical system that condenses light onto the image capturing apparatus 204.

The image capturing system 200 also includes an Auto Focus (AF) sensor 205. The AF sensor 205 is for acquiring a signal necessary for focus detection. The image capturing system 200 also includes a signal processing unit 208 that performs processing on a signal output from the image capturing apparatus 204 or the AF sensor 205, such as a process to perform various corrections on the acquired image data or a process to compress data. The signal processing unit 208 performs a signal processing operation for performing various correction and compression processes on an input signal, as needed, and outputs the processed signal. The image capturing system 200 also includes a buffer memory unit 209 for temporarily storing image data, and an external interface unit (external I/F unit) 210 for communicating with an external computer 215 or the like. The image capturing system 200 also includes a recording medium 214 such as a semiconductor memory for recording or reading out captured image data, and a recording medium control interface unit (recording medium control I/F unit) 213 for recording or reading out the data on or from the recording medium 214. The recording medium 214 may be incorporated in the image capturing system 200, or may be detachably mounted on the image capturing system 200. Communication with the recording medium 214 from the recording medium control I/F unit 13 and communication from the external I/F unit 210 may be established by a wireless connection.

The image capturing system 200 further includes an overall control/calculation unit 212 that performs various calculations and controls the overall operation of the digital still camera, and a timing generation unit 211 that outputs various timing signals to the image capturing apparatus 204 and the signal processing unit 208. Here, the timing signals may be input from the outside of the image capturing system 200, and the image capturing system 200 may include at least the image capturing apparatus 204 and the signal processing unit 208 that performs processing on the signal output from the image capturing apparatus 204. As described above, the control circuit 50 may control all operations and operation timings of the vertical scanning circuit 20 and the horizontal scanning circuit 30, or at least some of signals for controlling the operations and operation timings may be supplied from the timing generation unit 211. The overall control/calculation unit 212 and the timing generation unit 211 may be configured to execute some or all of the control functions of the image capturing apparatus 204.

The image capturing apparatus 204 outputs an image signal to the signal processing unit 208. The signal processing unit 208 performs predetermined signal processing on the image signal output from the image capturing apparatus 204, and outputs image data. Further, the signal processing unit 208 generates an image using the image signal. In addition, the signal processing unit 208 may perform a ranging calculation on the signal output from the image capturing apparatus 204. The signal processing unit 205 and the timing generation unit 211 may be mounted in the image capturing apparatus 204. Alternatively, the signal processing unit 208 and the timing generation unit 211 may be provided on a substrate on which the photoelectric conversion elements 11 are disposed, or on another substrate as described in the fourth exemplary embodiment. By configuring the image capturing system 200 with any of the image capturing apparatuses according to the exemplary embodiments described above, the image capturing system 200 capable of acquiring high-quality images can be achieved.

Figure 11A:
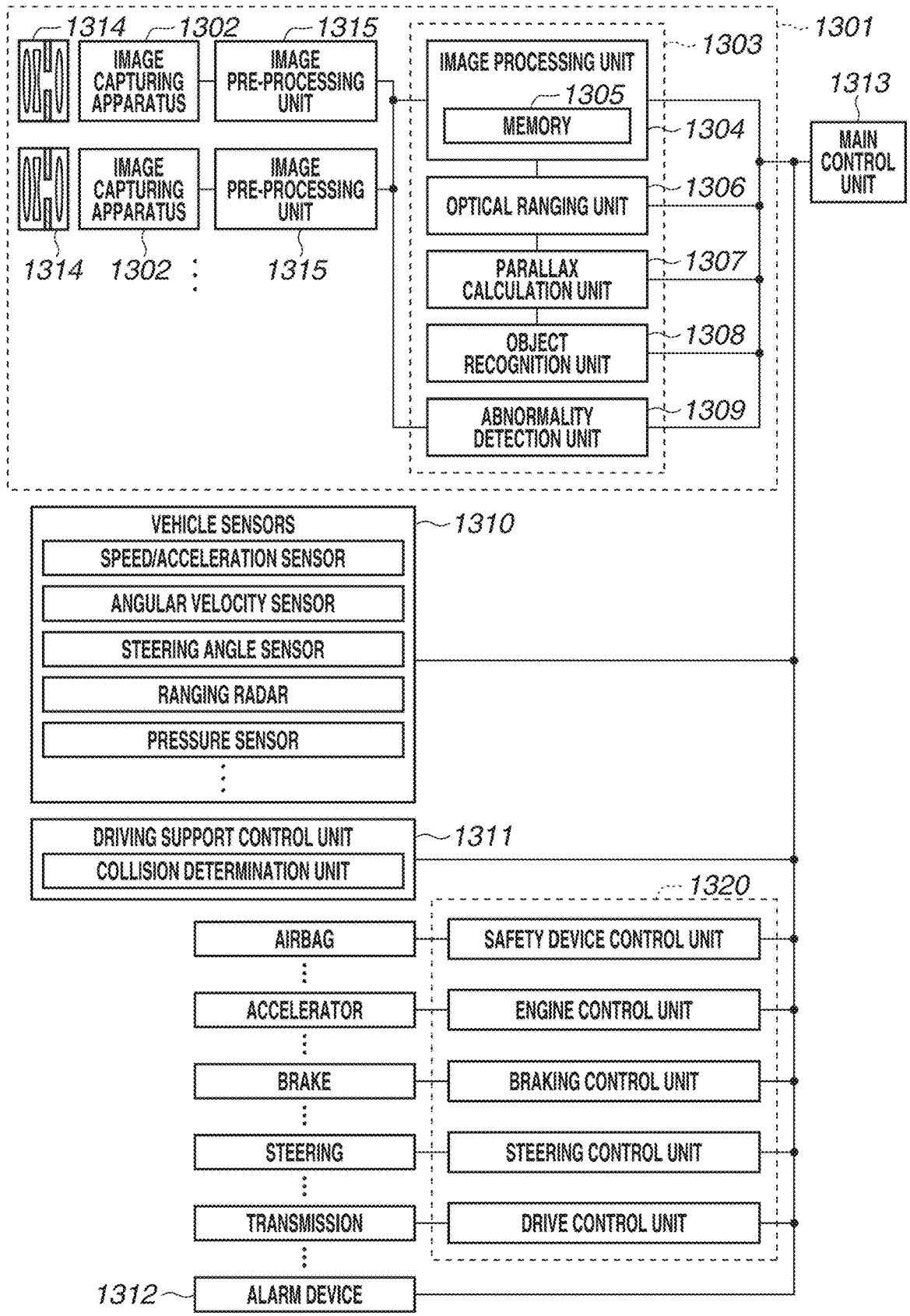
FIG. 11A is a block diagram illustrating a configuration example of an image capturing system according to a sixth exemplary embodiment.
Figure 11B:
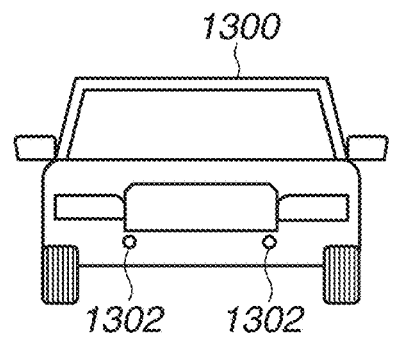
FIG. 11B is a schematic view illustrating a configuration example of a moving body according to the sixth exemplary embodiment.
Figure 11B:
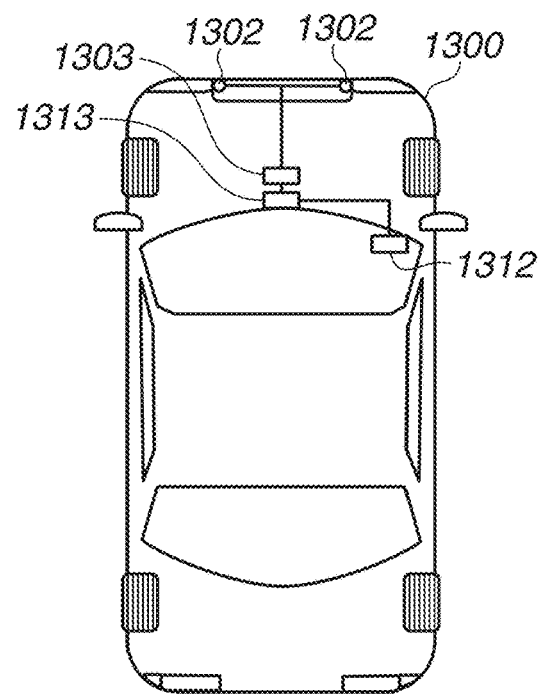
Figure 11B:
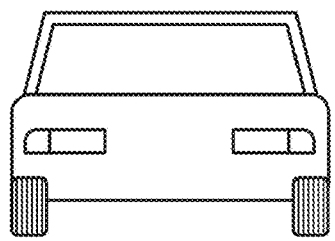
Figure 12:
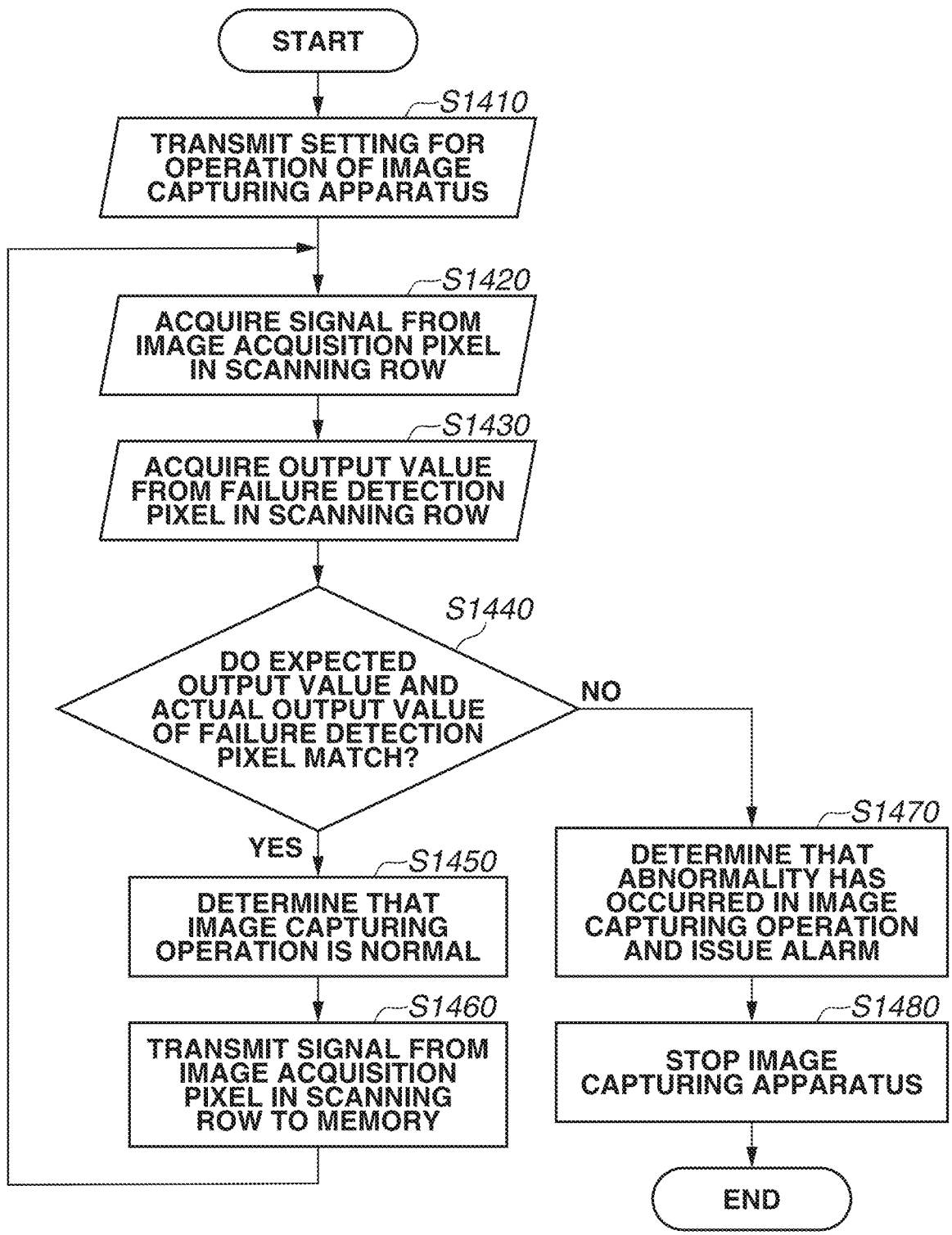
FIG. 12 is a flowchart illustrating an operation performed by the image capturing system according to the sixth exemplary embodiment.

An image capturing system 1301 and a moving body according to a sixth exemplary embodiment will be described with reference to FIGS. 11A, 11B, and 12. FIG. 11A is a block diagram illustrating a configuration example of the image capturing system 1301 according to the present exemplary embodiment, and FIG. 11B is a schematic view illustrating a configuration example of the moving body according to the present exemplary embodiment. FIG. 12 is a flowchart illustrating an operation performed by the image capturing system according to the present exemplary embodiment. In the present exemplary embodiment, an on-vehicle camera will be described as an example of the image capturing system 1301.

FIG. 11A illustrates a configuration example of a vehicle system and the image capturing system 1301 mounted thereon. The image capturing system 1301 includes image capturing apparatuses 1302, image pre-processing units 1315, an integrated circuit 1303, and optical systems 1314. Each of the optical systems 1314 forms an optical image of a subject on the corresponding image capturing apparatus 1302. The image capturing apparatus 1302 converts the optical image of the subject formed by the optical system 1314 into an electric signal. The image capturing apparatus 1302 is any one of the image capturing apparatuses according to the exemplary embodiments described above. Each of the image pre-processing units 1315 performs predetermined signal processing on the signal output from the image capturing apparatus 1302. The function of the image pre-processing unit 1315 may be incorporated in the image capturing apparatus 1302. In the image capturing system 1301, at least two sets of the optical system 1314, the image capturing apparatus 1302, and the image pre-processing unit 1315 are provided. A signal output from the image pre-processing unit 1315 in each of the sets is input to the integrated circuit 1303.

The integrated circuit 1303 is designed for use in an image capturing system. The integrated circuit 1303 includes an image processing unit 1304 including a memory 1305, an optical ranging unit 1306, a parallax calculation unit 1307, an object recognition unit 1308, and an abnormality detection unit 1309. The image processing unit 1304 performs image processing, such as development processing and defect correction processing, on the output signal from the image pre-processing unit 1315. The memory 1305 primarily stores a captured image and stores a defect position in pixels of the captured image. The optical ranging unit 1306 performs focusing of a subject and ranging. The parallax calculation unit 1307 calculates parallax information (a phase difference between parallax images) from a plurality of pieces of image data acquired by the plurality of image capturing apparatuses 1302. The object recognition unit 1308 recognizes a subject such as a vehicle, road, sign, and person. Upon detecting an abnormality in the image capturing apparatus 1302, the abnormality detection unit 1309 issues an alarm about the abnormality to a main control unit 1313.

The integrated circuit 1303 may be implemented by hardware designed for exclusive use, may be implemented by a software module, or may be implemented by a combination thereof. Furthermore, the integrated circuit 1303 may be implemented by a field programmable gate array (FPGA), an application specific integrated circuit (ASIC), or the like, or a combination thereof.

The main control unit 1313 controls the operations of the image capturing system 1301, vehicle sensors 1310, control units 1320, and the like in an integrated manner. Alternatively, the main control unit 1313 may be omitted, and each of the image capturing system 1301, the vehicle sensors 1310, and the control units 1320 may include a communication interface to transmit or receive a control signal via a communication network (for example, according to a controller area network (CAN) standard).

The integrated circuit 1303 includes a function of receiving a control signal from the main control unit 1313, or transmitting a control signal and a setting value to each of the image capturing apparatuses 1302 using a control unit of the integrated circuit 1303.

The image capturing system 1301 is connected to the vehicle sensors 1310, and thus can detect a travelling state of the own vehicle such as a vehicle speed, a yaw rate, and a steering angle, an environment outside the vehicle, and states of the other vehicles and obstacles. The vehicle sensors 1310 also serve as a distance information acquisition unit that acquires distance measurement information about a distance from a parallax image to a target object. The image capturing system 1301 is also connected to a driving support control unit 1311 that performs various types of driving support such as automatic steering, automatic cruising, and a collision prevention function. In particular, as for a collision determination function, a collision of the vehicle with any other vehicle or an obstacle is estimated or determined based on a detection result by the image capturing system 1301 or the vehicle sensors 1310. Thus, collision avoidance control is performed when a collision is estimated to occur, and a safety device is activated when a collision occurs.

The image capturing system 1301 is also connected to an alarm device 1312, which issues an alarm to the driver, based on a determination result by a collision determination unit. For example, if a collision is highly likely to occur based on the determination result by the collision determination unit, the main control unit 1313 performs vehicle control for avoiding the collision or reducing damage, for example, by applying the brake, releasing the accelerator, or suppressing the engine output. The alarm device 1312 issues an alarm to the user, for example, by sounding an alarm, displaying alarm information on a display unit screen of a car navigation system, a meter panel, or the like, or applying a vibration to the seat belt or the steering wheel.

In the present exemplary embodiment, the image capturing system 1301 captures an image of the periphery of the vehicle, for example, an image of the front or back of the vehicle. FIG. 11B illustrates a layout example in the case of capturing an image of the front of a vehicle 1300 using the image capturing system 1301.

The two image capturing apparatuses 1302 are arranged at the front side of the vehicle 1300. More specifically, assuming that the central line with respect to the forward/backward direction of the vehicle 1300 or the contour (e.g., width) of the vehicle 1300 is a symmetric axis, it is desirable that the two image capturing apparatuses 1302 are arranged symmetric about the symmetric axis in order to acquire information of the distance between the vehicle 1300 and a target object and determine the possibility of occurrence of a collision. In addition, it is desirable that the image capturing apparatuses 1302 are arranged at positions where the driver's view is not obstructed when the driver visually observes an outside state of the vehicle 1300 from the driver's seat. Furthermore, it is desirable that the alarm device 1312 is arranged at a position where the alarm device 1312 can easily come into the driver's view.

Next, a failure detection operation performed by each of the image capturing apparatuses 1302 in the image capturing system 1301 will be described with reference to FIG. 12. The failure detection operation performed by the image capturing apparatus 1302 is executed according to steps S1410 to S1480 illustrated in FIG. 12.

In step S1410, a setting for starting up the image capturing apparatus 1302 is made. More specifically, a setting for operation of the image capturing apparatus 1302 is transmitted from the outside of the image capturing system 1301 (e.g., the main control unit 1313) or from the inside of the image capturing system 1301, and the image capturing operation and failure detection operation of the image capturing apparatus 1302 are started.

Next, in step S1420, a pixel signal is acquired from an effective pixel in a scanning row. In step S1430, an output value is acquired from a failure detection pixel provided for failure detection. The failure detection pixel includes an avalanche diode that functions as a photoelectric conversion unit, similarly to the effective pixel. A predetermined voltage is written into this photoelectric conversion unit. The failure detection pixel outputs a signal corresponding to the voltage written into the photoelectric conversion unit. Steps S1420 and S1430 may be reversed.

Next, in step S1440, it is determined whether an expected output value and the actual output value of the failure detection pixel match. As a result of the determination in step S1440, if the expected output value and the actual output value match (YES in step S1440), the processing proceeds to step S1450. In step S1450, it is determined that the image capturing operation is normally performed, and then the processing proceeds to step S1460. In step S1460, the pixel signal acquired from the effective pixel in the scanning row is transmitted and primarily stored in the memory 1305. Then, the processing returns to step S1420 to continue the failure detection operation. On the other hand, as a result of the determination in step S1440, if the expected output value and the actual output value do not match (NO in step S1440), the processing proceeds to step S1470. In step S1470, it is determined that an abnormality has occurred in the image capturing operation, and an alarm is issued to the main control unit 1313 or the alarm device 1312. The alarm device 1312 causes the display unit to display information indicating that an abnormality is detected. Then, in step S1480, the image capturing apparatus 1302 is stopped to terminate the operation of the image capturing system 1301.

While the present exemplary embodiment illustrates the example where the steps in the flowchart are executed in a loop for each row, the steps in the flowchart may be executed in a loop for a plurality of rows, or the failure detection operation may be performed for each frame. In step S1470, an alarm may be issued to send a notification to the outside of the vehicle 1300 via a wireless network.

While the present exemplary embodiment describes the control operation for preventing the vehicle from colliding with any other vehicle, the present exemplary embodiment can also be applied to, for example, a control operation for performing automatic driving following another vehicle, and a control operation for performing automatic driving to prevent the vehicle from deviating from a lane. In addition, the image capturing system 1301 can be applied to not only a vehicle such as a user's own vehicle, but also, for example, a moving body (movable apparatus) such as a ship, an aircraft, or an industrial robot. Furthermore, the image capturing system 1301 can be applied to not only the moving body, but also a device that uses object recognition extensively, such as an intelligent transportation system (ITS).

The image capturing apparatuses according to the exemplary embodiments of the present disclosure may further include a color filter or a microlens and may be configured to be able to acquire various information such as distance information.

The present disclosure is not limited to the above-described exemplary embodiments and can be modified in various ways. An example where some of the components according to one of the exemplary embodiments are added to any other exemplary embodiment, and an example where some of the components according to one of the exemplary embodiments are replaced with some of the components according to any other exemplary embodiment are also included in the exemplary embodiments of the present disclosure. For example, as with the first exemplary embodiment, it is possible to control whether to output a signal from the signal processing circuit SP while controlling the active state and the inactive state of the avalanche diode D. The exemplary embodiments described above merely illustrate specific examples for carrying out the present disclosure, and the technical scope of the present disclosure should not be limitatively interpreted by the exemplary embodiments. The present disclosure can be implemented in various modes without departing from the technical idea of the present disclosure or the principal features of the present disclosure.

The exemplary embodiments described above can improve the characteristics of a photon-counting image capturing apparatus using an avalanche diode, such as power consumption and signal readout speed.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-210035, filed Nov. 20, 2019, which is hereby incorporated by reference herein in its entirety.

What is claimed is:

1. An image capturing apparatus comprising:
a plurality of photoelectric conversion elements disposed in a first direction and a second direction, each of the plurality of photoelectric conversion elements including an avalanche diode and a counter configured to count signals based on light incident on the avalanche diode, the plurality of photoelectric conversion elements having a first photoelectric conversion element and a second photoelectric conversion element;
a first selection circuit configured to control the first photoelectric conversion element; and
a second selection circuit configured to control the second photoelectric conversion element,
wherein in a first mode, the first selection circuit controls the first photoelectric conversion element to be brought into a state where a signal is read out from the first photoelectric conversion element, and the second selection circuit controls the second photoelectric conversion element to be brought into a state where no signal is read out from the second photoelectric conversion element, and
wherein in a second mode set in a period different from a period in which the first mode is set, the second selection circuit controls the second photoelectric conversion element, which has been controlled to be brought into the state where no signal is read out from the second photoelectric conversion element, to be brought into a state where a signal is read out from the second photoelectric conversion element, and
wherein the first selection circuit controls whether to read out a signal from the counter included in the first photoelectric conversion element, and the second selection circuit controls whether to read out a signal from the counter included in the second photoelectric conversion element.

2. The image capturing apparatus according to claim 1, wherein in the second mode, the first selection circuit controls the first photoelectric conversion element, which has been controlled to be brought into the state where the signal is read out from the first photoelectric conversion element, to be brought into a state where no signal is read out from the first photoelectric conversion element.

3. The image capturing apparatus according to claim 2, further comprising a third selection circuit configured to control the first photoelectric conversion element and a fourth selection circuit configured to control the second photoelectric conversion element,
wherein in the first mode, the third selection circuit controls the first photoelectric conversion element to be brought into the state where the signal is read out from the first photoelectric conversion element by controlling the avalanche diode of the first photoelectric conversion element to be brought into a state where a reverse bias voltage capable of causing avalanche multiplication is applied to the avalanche diode of the first photoelectric conversion element, and the fourth selection circuit controls the second photoelectric conversion element to be brought into the state where no signal is read out from the second photoelectric conversion element by controlling the avalanche diode of the second photoelectric conversion element to be brought into a state where the reverse bias voltage capable of causing avalanche multiplication is not applied to the avalanche diode of the second photoelectric conversion element.

4. The image capturing apparatus according to claim 3, wherein at least some of the plurality of photoelectric conversion elements are arranged in the first direction,
wherein the first mode corresponds to a period in which first vertical scanning is performed, and
wherein the second mode corresponds to a period in which second vertical scanning is performed.

5. The image capturing apparatus according to claim 2, wherein a region from which a signal is read out in the first mode is different from a region from which a signal is read out in the second mode.

6. The image capturing apparatus according to claim 5, wherein in the first mode, the avalanche diode of the first photoelectric conversion element and the avalanche diode of the second photoelectric conversion element perform photoelectric conversion.

7. The image capturing apparatus according to claim 2, wherein in the second mode, the first selection circuit controls the first photoelectric conversion element, which has been controlled to be brought into the state where the signal is read out from the first photoelectric conversion element, to be maintained in the state where the signal is read out from the first photoelectric conversion element.

8. The image capturing apparatus according to claim 7, wherein in a case where a target object appears in a region where the image capturing apparatus performs image capturing, the first mode is changed to the second mode.

9. The image capturing apparatus according to claim 1, wherein the first and second selection circuits are controlled by a first control line disposed extending in the first direction and a second control line disposed extending in the second direction.

10. The image capturing apparatus according to claim 9, further comprising a vertical scanning circuit and a horizontal scanning circuit,
wherein the first control line is connected to the vertical scanning circuit,
wherein the second control line is connected to the horizontal scanning circuit, and
wherein the first selection circuit and the second selection circuit are controlled by the vertical scanning circuit and the horizontal scanning circuit, respectively.

11. The image capturing apparatus according to claim 10,
wherein each of the plurality of photoelectric conversion elements includes a quench element connected to the avalanche diode, and
wherein the third selection circuit controls turning on and off of the quench element of the first photoelectric conversion element.

12. The image capturing apparatus according to claim 11, wherein the first selection circuit comprises a combination circuit.

13. The image capturing apparatus according to claim 12, wherein the combination circuit is an AND circuit.

14. The image capturing apparatus according to claim 1, further comprising a fifth selection circuit configured to control the first photoelectric conversion element and a sixth selection circuit configured to control the second photoelectric conversion element,
wherein each of the plurality of photoelectric conversion elements is connected to a third control line for controlling a potential to be applied to one of an anode and a cathode of the avalanche diode,
wherein the third control line includes a first voltage line for supplying a potential to prevent the avalanche diode from causing avalanche multiplication, and a second voltage line for supplying a potential to enable the avalanche diode to cause avalanche multiplication, and
wherein the fifth selection circuit and the sixth selection circuit select a control line to be connected to the avalanche diode between the first voltage line and the second voltage line.

15. The image capturing apparatus according to claim 1, wherein in the first mode, the second selection circuit controls the counter included in the second photoelectric conversion element not to perform counting.

16. The image capturing apparatus according to claim 1, further comprising a first substrate and a second substrate stacked on the first substrate,
wherein the first substrate includes the counter, and
wherein the second substrate includes the avalanche diode.

17. The image capturing apparatus according to claim 16, wherein the photoelectric conversion element includes an inverter circuit, and
wherein the second substrate includes the inverter circuit.

18. The image capturing apparatus according to claim 17, wherein the photoelectric conversion element includes a quench element, and
wherein the second substrate includes the quench element.

19. An image capturing system comprising:
an image capturing apparatus according to claim 1; and
a signal processing circuit configured to perform processing on a signal output from the image capturing apparatus.

20. A moving body comprising:
an image capturing apparatus according to claim 1;
a distance information acquisition circuit configured to acquire distance information from information based on a signal output from the image capturing apparatus, the distance information indicating a distance to a target object; and
a control circuit configured to control the moving body based on the distance information.

* * * * *